United States Patent [19]
Lochon et al.

[11] Patent Number: 5,137,845
[45] Date of Patent: Aug. 11, 1992

[54] METHOD OF FORMING METAL CONTACT PADS AND TERMINALS ON SEMICONDUCTOR CHIPS

[75] Inventors: Henri Lochon, Saintry-sur-Seine; Georges Robert, La Ferte-Alais, both of France

[73] Assignee: International Business Machines Corporation, Armonk, N.Y.

[21] Appl. No.: 729,506

[22] Filed: Jul. 12, 1991

[30] Foreign Application Priority Data

Jul. 31, 1990 [EP] European Pat. Off. ......... 90480110.7

[51] Int. Cl.$^5$ ............................................. H01L 21/44
[52] U.S. Cl. ..................................... 437/183; 437/189; 437/203; 437/228; 148/DIG. 143
[58] Field of Search .................. 437/183, 189, 228; 148/DIG. 143

[56] References Cited

U.S. PATENT DOCUMENTS 4,113,578  9/1978  Del Monte ....................... 437/183
4,427,715  1/1984  Harris ............................... 437/183

FOREIGN PATENT DOCUMENTS 56-49543  5/1981  Japan ................................. 437/183

*Primary Examiner*—Brian E. Hearn
*Assistant Examiner*—Laura Holtzman
*Attorney, Agent, or Firm*—Charles W. Peterson, Jr.

[57] ABSTRACT

A method of forming metal contact terminals (35) of a determined size having an insulating substrate (17) with a metal land (18) formed thereon and a passivating layer (19) provided with an opening exposing a part of the metal land by forming intermediate metal contact pad (33') in the contact opening, applying and patterning a photoresist, delineating the intermediate metal contact pad (33') using pattern (31) as an in-situ mask, depositing a lead-tin solder layer (34') over a metal mask to form a solder bump (34') on the final metal contact pad, and reflowing the solder to form a solder ball (34). Thereby achieving the metal contact terminal (35) at the contact pad site. The above method has applicability to the fabrication of contact terminals for high density/high count I/O connections for advanced semiconductor chips that are appropriate for flip-chip (C4) or face-down bonding thereof on metallized ceramic (MC) substrates.

9 Claims, 6 Drawing Sheets

METHOD OF FORMING METAL CONTACT PADS AND TERMINALS ON SEMICONDUCTOR CHIPS

BACKGROUND OF THE INVENTION

The present invention relates to the semiconductor integrated circuits chip manufacturing and more particularly to a method of forming metal contact pads and contact terminals on semiconductor chips for purposes of face-down bonding to the metal conductors of a metallized carrier such as a metallized ceramic (MC) substrate.

Solder reflow is also known under the generic name of "flip-chip" or Controlled Collapse Chip Connection (C4) technique. The latter is described in particular in U.S. Pat. No. 3,401,126 and 3,419,040 assigned to the assignee of the present invention. According to the C4 technique, the important point is the formation of contact terminals on the semiconductor chip contact sites, each consisting of a metal pad surmounted by a Pb-Sn solder ball. The C4 technique also relies on the formation of solder joinable sites on the metal conductors of the MC substrate. The solder joinable sites are surrounded by non-solderable barriers so that when the solder of the solder joinable sites and of the chip contact terminals melt and merge, the surface tension holds the semiconductor chip by solder columns, as if suspended above the MC substrate. After cooling, the chip is firmly maintained face-down on the metal conductors by these very small, closely spaced solder column interconnections.

With the development of the integrated circuit semiconductor chip technology, the size of individual active and passive devices has become very small causing the number of devices in a chip to increase dramatically. The size of modern chips tends to increase too. This trend will continue and place an increasingly higher demand on the density of contact terminals for input/output connections and the overall number thereof. An advantage of solder reflow joining as practiced in the C4 technique, is that I/O contact terminals can be distributed over substantially the entire top surface of the semiconductor chip, which is more commonly known as the bonding area, therefore allowing an efficient use thereof.

FIG. 1 illustrates a schematical cross-sectional view of a portion of a standard semiconductor chip structure referenced 10 provided with a typical multilevel metallurgy. The fabrication of the chip is entirely conventional and may be completed by any of a number of known processes. For sake of illustration, the chip may be fabricated using CMOS technology with three layers of metal interconnection wiring and I/O contact terminals using the afore-mentioned C4 technique. As shown in FIG. 1, the chip structure has a semiconductor body 11 of one conductivity type with an insulating layer 12, typically of silicon dioxide ($SiO_2$) on the upper surface thereof. Formed in the body 11 is an active diffused/implanted region 13 of an opposite conductivity type. The first level conductive pattern comprises metal lands 14. One land 14 is in contact with region 13 through an opening in layer 12. Other portions of the conductor pattern 14 extend on the surface of layer 12. An insulating layer 15, e.g. $SiO_2$, glass or quartz, is formed over layer 12 and metal lands of the first level conductive pattern. Metal lands 16 of the second level conductive pattern are formed on insulating layer 15 and contacts the first level metallization through a via hole. Typically metal lands are made of aluminum Overlying insulating layer 17 and metal lands 18 of the third level conductive pattern is a new passivating layer 19. At the top surface of the chip structure, a composite assembly comprised of a contact pad 20 and a solder ball 21 makes an electrical contact to metal land 18, through a contact opening in passivating layer 19. This composite assembly forms the so-called chip contact terminal 22.

FIG. 2 is an enlarged view of the top part of chip structure 10 of FIG. 1 including contact pad 20 and solder ball 21. As illustrated in more details in FIG. 2, where said top part referenced 23 forms the base structure, contact pad 20 is comprised of a lower chromium (Cr) layer 24, an intermediate copper (Cu) layer 25, and an upper gold (Au) layer 26. A chromium/copper overlap layer is generally inserted between layers 24 and 25. More details on that particular Cr-Cu-Au contact pad structure can be found in EP-A-0061593 assigned to the the present assignee These sandwiched layers form the so-called ball limiting metallurgy (BLM). However, other metal combinations (e.g. TiW, Cu, Au) can be used as well, provided they have the desired adhesion and diffusion barrier properties, to avoid metal corrosion problems. The general pad shape is circular, but different shapes can be envisioned.

Originally, in the 1960's, when the C4 technique was invented, the three metal layers, forming the ball limiting metallurgy of FIG. 2, were sequentially deposited by vacuum evaporation through an apertured molybdenum mask. However for advanced 125 mm semiconductor wafers a typical configuration consists of $27 \times 27 = 729$ contact pads arranged in a matrix with a pitch of $100 \times 230$ $\mu$m and a pad diameter of 100 $\mu$m, the use of molybdenum masks that are 100 $\mu$m thick is infeasible. Producing more contact pads means producing more holes of smaller diameter (e.g. 75 $\mu$m) in the mask, and therefore implies reducing the mask thickness to less than 75 $\mu$m. This results from the double-side etch process that is conventionally used to create the holes. Unfortunately, such a thickness is unacceptable because the mask would warp during the evaporation step. Only photolithographic processes appeared to be able to solve this acute problem. Two different variants have been investigated so far to produce the contact pad structure 20 of FIG. 2, the lift-off technique and the sub-etch technique, which are both illustrated in FIG. 3.

Now referring to FIG. 3AA, in the lift-off technique, a photoresist layer PR is applied onto the base structure 23 baked for hardening, then exposed to UV light through a mask (not shown) to make soluble the unexposed portion of layer PR. The soluble portions of the photoresist layer PR are removed in a development bath. As shown in FIG. 3BA, the resist aperture has a typical negative profile. This necessitates the use of complex photoligraphic techniques such as MIRP (Modified Image Reverse Process). Next, metal layers of Cr, Cu, and Au respectively referenced 24, 25 and 26 are blanket deposited in sequence in a vacuum evaporator. The remaining portions of the photoresist layer PR are dissolved in hot N-methyl-pyrrolidone (NMP) and the metal located thereupon is lifted off leaving the metal contact pad structure 20 of FIG. 3C.

Alternatively, the metal contact pad structure may be formed, according to the so-called metal sub-etch technique, that is illustrated in FIGS. 3AB and 3BB. Turning to FIG. 3AB, first, the three metal layers of Cr, Cu, Au referenced 24', 25' and 26' are sequentially blanket deposited onto the base structure 23 in a vacuum evaporator. The contact pad will now be defined by standard photo-lithography. To this end, a photoresist layer PR' is applied onto the base structure. The resist layer PR' is exposed to UV light through a mask (not shown), then developed as illustrated in FIG. 3BB. The remaining portions of the photo resist layer that are insoluble in the development bath are used as an in-situ mask to remove the exposed underlying metal layers by chemical etching, thereby defining the metal contact pad structure 20 as shown in FIG. 3C.

At this stage of the process, irrespective the variants used to form the contact pad structure 20, solder balls are formed. The technique described in U.S. Pat. No. 3,458,925 assigned to the present assignee is still appropriate. To this end, a suitable mask, as of molybdenum (not represented), having holes therein corresponding to and somewhat larger than the contact pad structure is placed over the chip structure 10 so that the holes of the mask are aligned with the contact pads. A layer 21' of 95% lead-5% tin solder, is then evaporated through the mask holes. However, other solder compositions may be used as well. Prior to reflow, the typical solder bump or mound 21' that has just been formed, completely covers the contact pad structure 20 and the surrounding portions of the passivating layer 19 at the vicinity thereof as shown in FIG. 3D. After the solder evaporation is completed, the mask is removed, and the chip heated to reflow the solder, which as it melts, it gradually dewets the surface of the passivating layer, and draws-up into the desired ball configuration 21 on top of the contact pad structure 20 (FIG. 3E). After completion of the above described process, the chip is then ready for flip-chip or face-down bonding to a supporting metallized ceramic substrate in accordance with the various techniques of the prior art.

Both afore-mentioned variants have inherent limitations and/or drawbacks which make them non-satisfactory for use in the manufacturing lines.

In the lift-off technique (FIGS. 3AA & 3BA), the first concern is the poor adhesion of the metal layers forming the contact pad to the aluminum land underneath, because the maximum temperature during vacuum evaporation must be less than the resist bake temperature (e.g. inferior to 100° C.). In addition, the lift off technique implies the use of complex photo-lithographic steps (e.g. MIRP) to produce the negative profile in the apertures. Finally, there is a huge quantity of metal to remove because the ratio between the remaining metal surface after aperture completion and the wafer surface is extremely high, about 98%. As a consequence, the lift-off technique produces metal residues that are known to be a yield detractor. In the metal sub-etch technique (FIGS. 3AB & 3BB), the main concern is the remaining metal residues still because of the important etched quantity of metal. The problem is even more acute in this case, when compared to the lift-off technique, because the metal layers adhere well to the surface of the wafer.

In addition, in both variants, the highly desired step of RF cleaning using Argon (Ar) ions is a recommended initial process step to improve contact resistance, because Ar+ ions etch-back the native oxide that spontaneously forms on the parts of the metal lands that are exposed before contact pad formation. In the metal sub-etch technique, this RF cleaning step is performed prior to metal evaporation. As a result, the Ar+ ion bombardment is effected on the whole surface of the wafer so there is a risk of displacing or activating sodium ions (Na+) in the thin oxide layer forming the gate dielectric of FETs. These ions, can modify the amount of charges in the oxide layer with well known inconveniences as to the threshold voltages of FETs. In the lift-off technique, this RF cleaning step is not possible at all, because of the low temperature that is required to bake photoresist layer PR. The ion bombardment is known to heat the wafer at a temperature (about 150° C.) that would cause photoresist layer PR to flow.

OBJECTS OF THE INVENTION

It is therefore a primary object of the invention to provide a method of forming metal contact pads and terminals on semiconductor chips wherein the amount of metal to be eliminated is minimized to avoid metal residues that are a yield detractor.

It is another object of the invention to provide a method of forming metal contact pads and terminals on semiconductor chips avoiding the use of complex photolithographic techniques such as MIRP.

It is still another object of the invention to provide a method of forming metal contact pads and terminals on semiconductor chips wherein the metal layers forming the contact pads have excellent adhesion to the underlying aluminum lands.

It is a further object of the invention to provide a method of forming metal contact pads and terminals on semiconductor chips wherein an efficient RF argon cleaning step may be achieved initially in the manufacturing steps to improve contact resistance with the underlying aluminum lands.

SUMMARY OF THE INVENTION

According to the basic concept of the present invention, there is disclosed a method of forming metal contact pads and terminals of a desired size on semiconductor chips based on a photo-lithographic technique so that the dimensions of the contact pads can be reduced to cope with the progress of the technology. An intermediate metal contact pad having dimensions or size greater than desired is formed through a contact opening exposing a metal land, as is standard using a conventional thick molybdenum mask. Then, the dimensions or size of this intermediate contact pad are reduced through a standard lithographic step to produce a metal contact pad having the desired size. Next, using the same molybdenum mask as above, solder is deposited to form a solder bump covering said contact pad in excess. The structure is reflowed to form the solder ball that terminates the metal contact terminal.

According to a preferred embodiment, the method of forming metal contact pads includes the steps of:
a) depositing at least one metal layer onto the structure through a mask having holes greater than the desired size to form an intermediate metal contact pad in the said contact opening and at the close vicinity thereof;
b) applying a photoresist layer onto the structure and patterning it to leave a pattern of the desired size aligned and above said intermediate contact pad exposing the part thereof in excess; and
c) delineating the intermediate contact pad using said pattern as an in-situ mask and removing the excess metal thereof to provide the final metal contact pad having the desired size;
d) removing the remaining photoresist pattern.

Still according to this method, prior to step a) the structure is submitted to a RF cleaning step by argon ion bombardment using the same mask.

Still further according to this method, after step d) the steps of forming the metal contact terminals are competed.

BRIEF DESCRIPTION OF THE DRAWINGS

The novel features believed to be characteristic of this invention are set forth in the appended claims. The invention itself, however, as well as other objects and advantages thereof, may best be understood by reference to the following detailed description of an illustrated preferred embodiment to be read in conjunction with the accompanying drawings.

In the drawings.

TECHNICAL DESCRIPTION OF THE PREFERRED EMBODIMENT

For purposes of illustration, a preferred embodiment of the method of fabricating metal contact pad and contact terminals according to this invention will be described in conjunction with FIGS. 4A to 4H.

Figure 1:
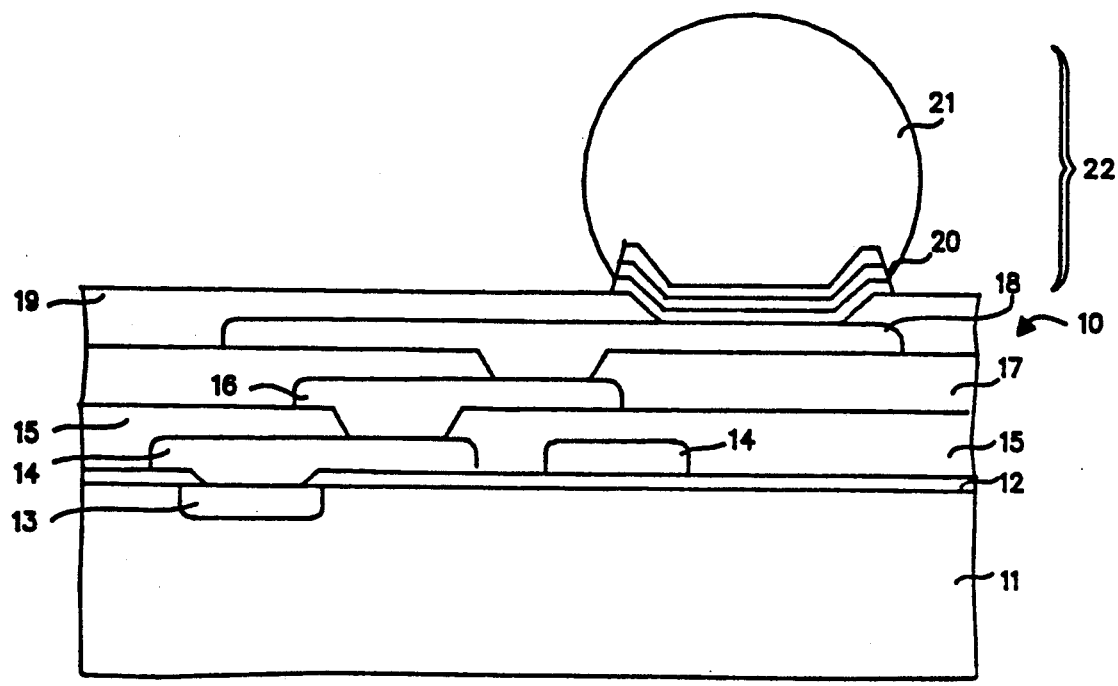
FIG. 1 is a cross-sectional view partially broken away of a conventional multilevel metallurgy semiconductor chip structure featuring a metal contact terminal of the C4 type.
Figure 2:
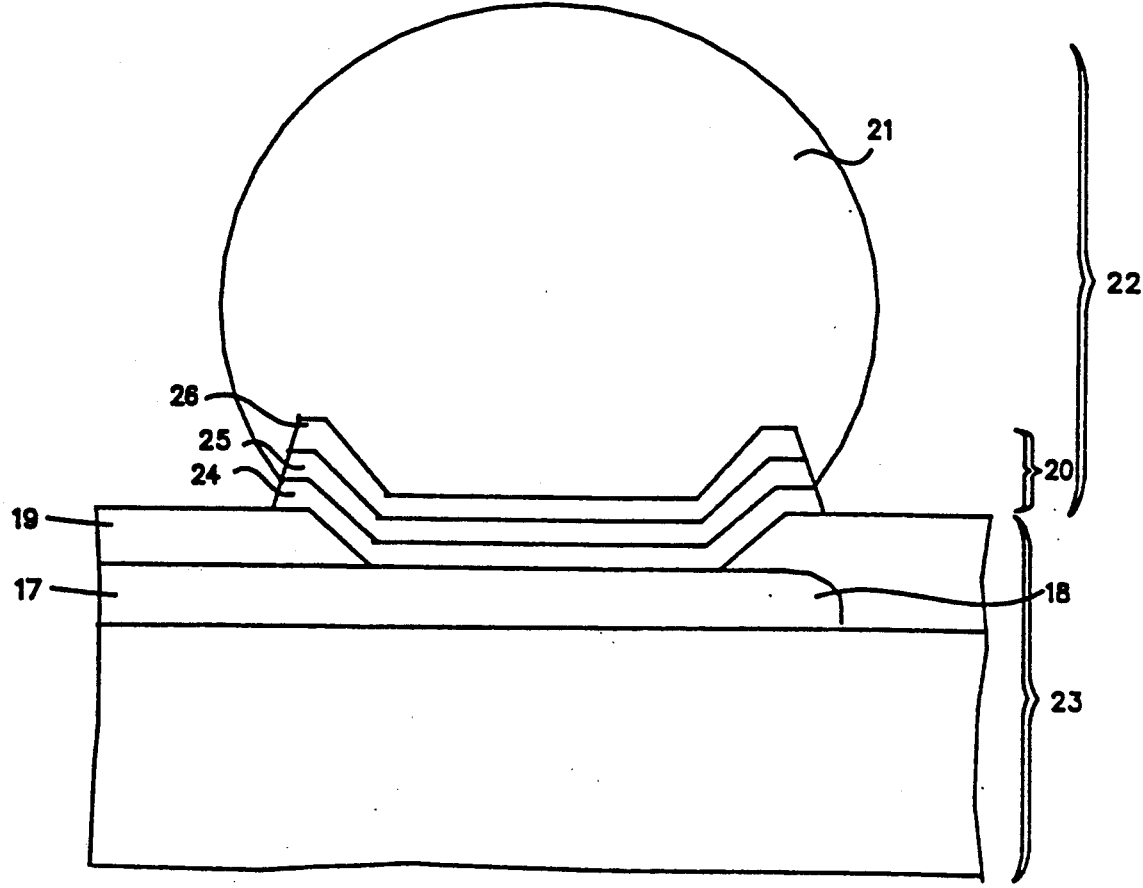
FIG. 2 is an enlarged cross-sectional view of the metal contact terminal of FIG. 1 illustrating more specifically the multi-layered contact pad structure and solder ball construction.
Figure 3:
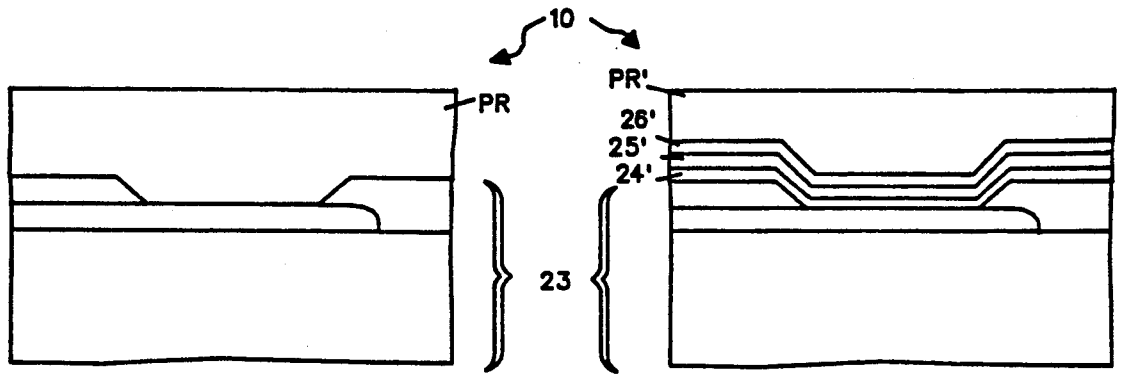
FIG. 3 illustrates sectional views of a semiconductor chip structure undergoing conventional fabrication in accordance with two known process variants of forming the metal contact terminal of FIG. 2.
Figure 3:
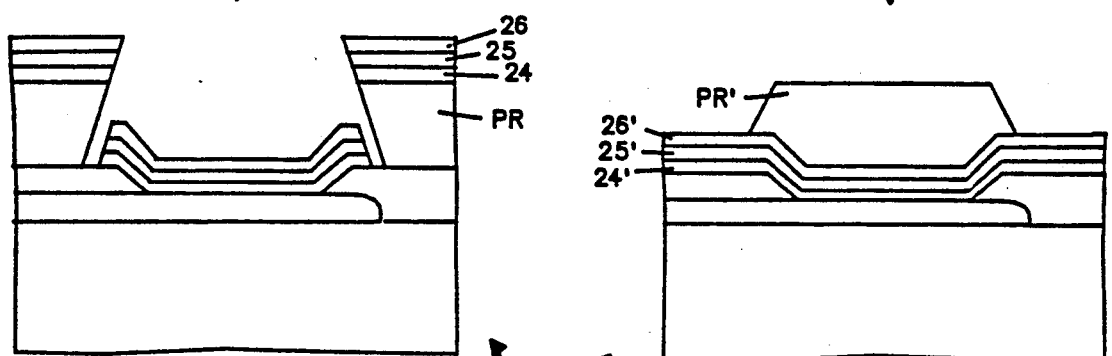
Figure 3:
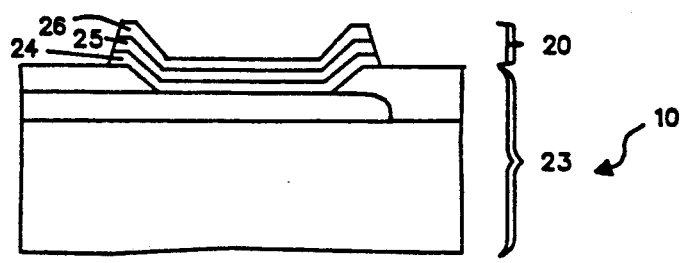
Figure 3D:
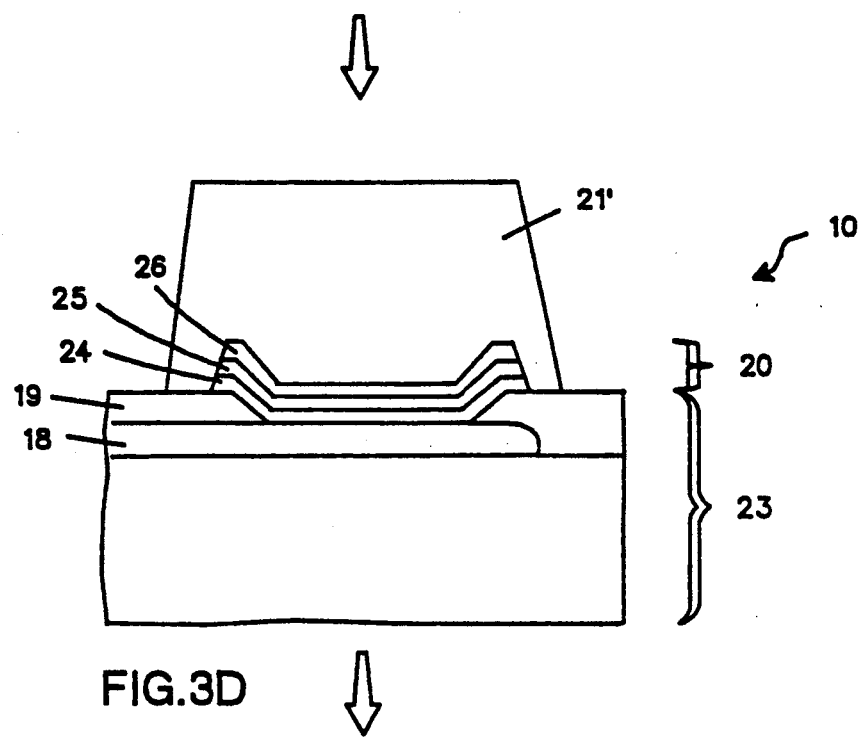
Figure 3E:
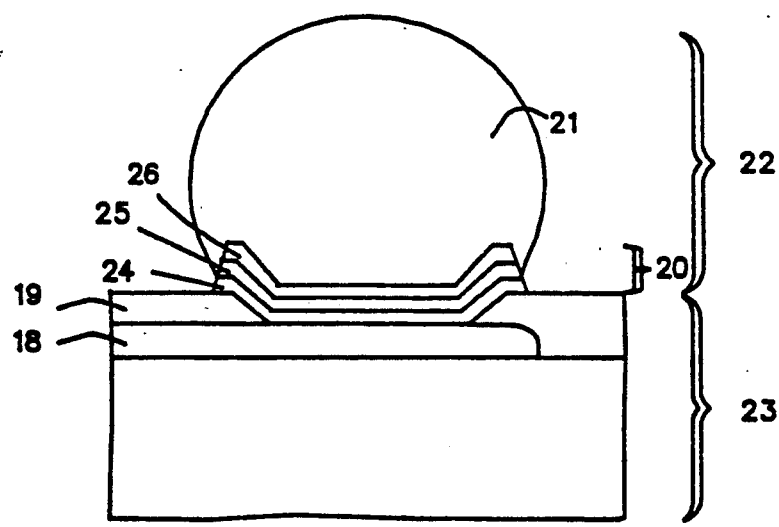
Figure 4A:
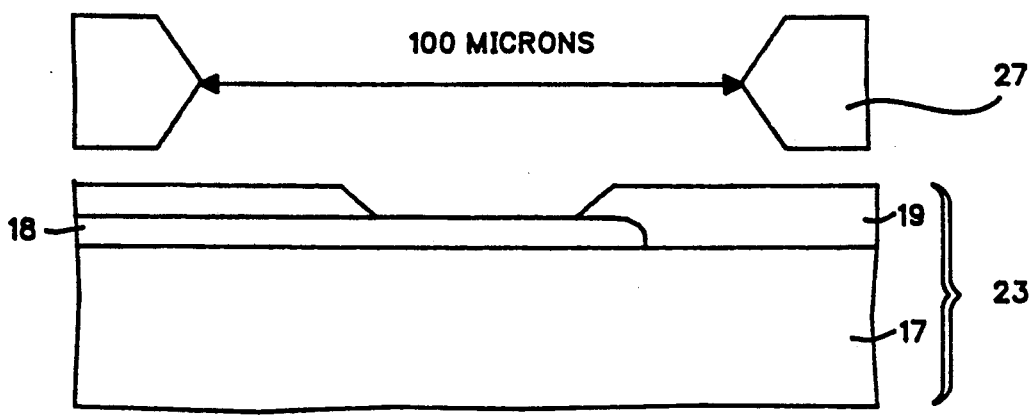
FIG. 4 shows the forming of the novel metal contact pad and contact terminal according to the method of the present invention.

A conventional 100 $\mu$m thick metal mask typically made of molybdenum, provided with 100 $\mu$m diameter holes is placed over the semiconductor wafer and aligned therewith. Because the thickness is not a sensitive parameter to the present method, thick molybdenum masks can be used without problems. In FIG. 4A, the top portion 23 of the semiconductor chip structure 10 used again as the base structure, and the molybdenum mask bearing numeral 27 have been shown. After mask 27 has been connected to the same potential as the electrode bearing the wafer, the structure is submitted to a bombardment of argon ions (Ar+). Argon ions etch back through the mask holes the native oxide that spontaneously forms on the exposed part of metal land 18 typically of aluminum, once a contact opening has been made through passivating layer 19. As a result, said land is appropriately cleaned. Because the solid part of the molybdenum mask 27 protects the rest of the chip structure from the ionic bombardment, the number of argon ions that are implanted in the gate oxide layer of underlying FETS is minimized thanks to the very high ratio between the respective surfaces of the solid part and the mask holes.

Figure 4B:
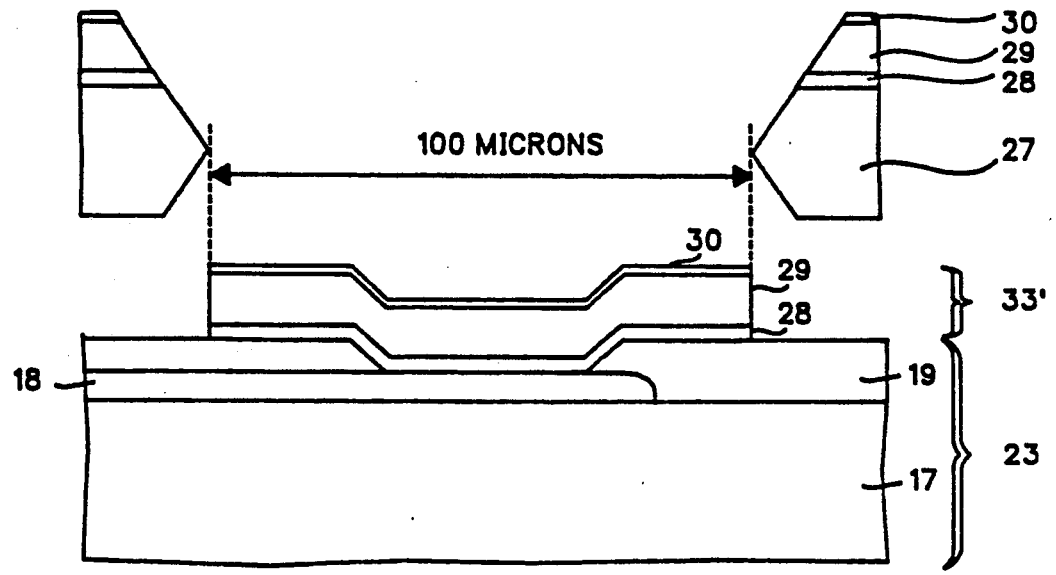

After RF cleaning, leaving the molybdenum mask 27 in place, the metal layers are deposited. Prior to deposition, the wafer is preferably heated to about 200° C. to improve adhesion of the said metal layers. First, the chromium layer 28, followed by the copper layer 29 (preferably a chromium/copper overlap layer can be inserted therebetween) and finally the gold layer 30 are deposited in an appropriate equipment, e.g. a Balzers model BAK 760. Respective thicknesses are 150 nm Cr, 100 nm Cr/Cu, 500 nm Cu and 100 nm Au. The resulting contact pad structure 33' has the typical multi-layered structure and a circular shape of about 100 $\mu$m diameter. The diameter of this intermediate contact pad 33' is therefore larger than the desired diameter of about 70 $\mu$m that is finally required for ultra high density contact terminal chips. At this stage of the fabricating process, the structure is shown in FIG. 4B.

It is an important feature of the invention to have both the RF cleaning step and the successive metal layer deposition step completed in sequence in the same vacuum evaporation equipment without moving out the molybdenum mask 27.

Figure 4C:
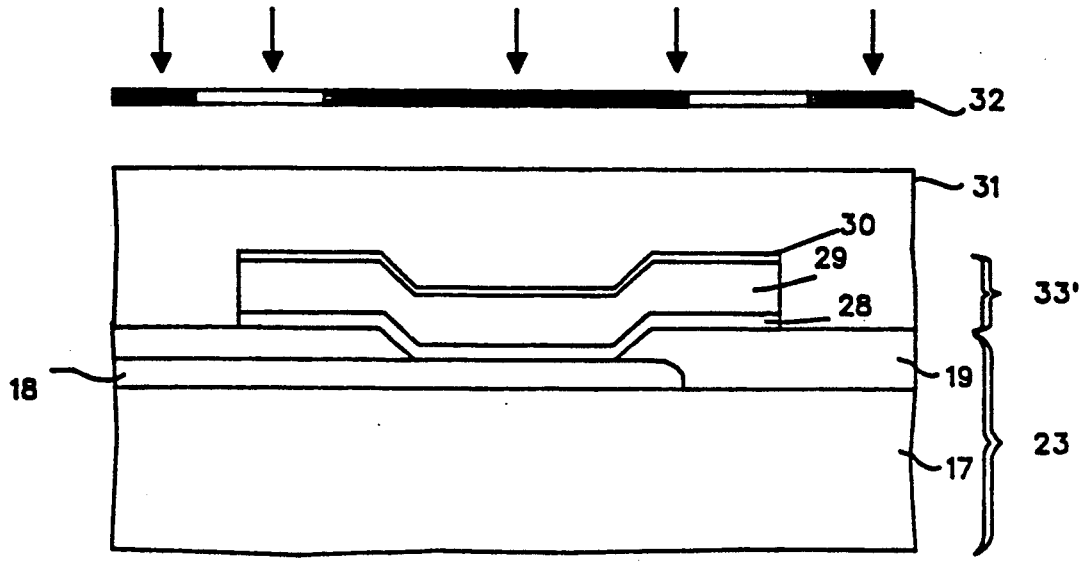

Now turning to FIG. 4C, a layer 3 of a positive photoresist such as AZ 1350 is then applied onto the chip structure and baked at 90° C. for hardening. A chromium mask 32 is placed over the silicon wafer and aligned therewith. Next, the photoresist layer 31 is exposed to UV light through the chromium mask in a stepper or proximity printer equipment such as MTI MULTIFAB model.

Figure 4D:
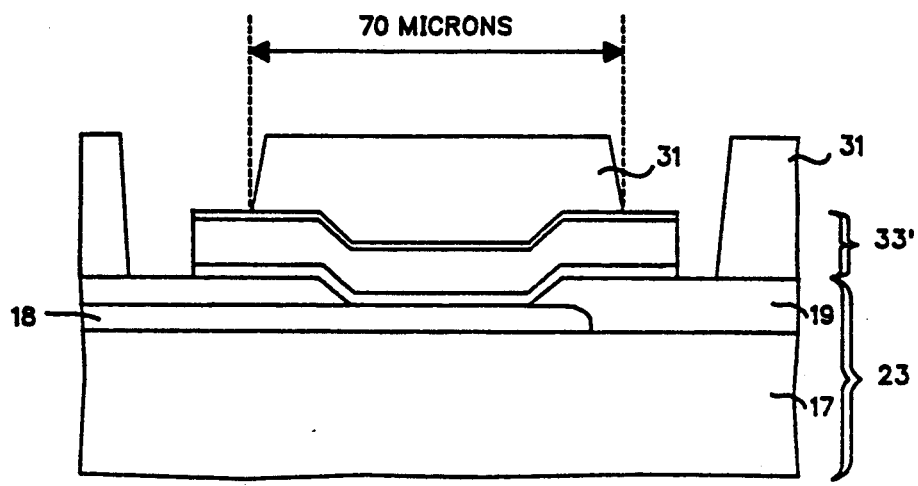

The photoresist layer 31 is developed in a developer e.g. an AZ developer. The resulting structure is shown in FIG. 4D. The remaining photoresist pattern 31 formed above the contact pad structure has a diameter of about 70 $\mu$m and leaves exposed an annular-shaped portion of the intermediate contact pad structure at its periphery.

Figure 4E:
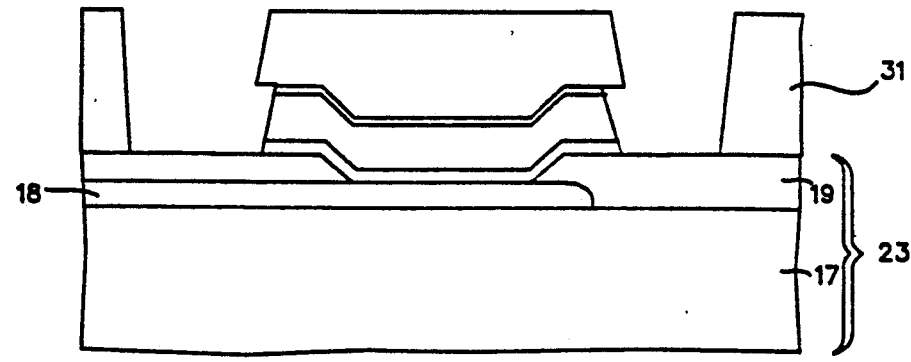

Now, turning to FIG. 4E, after a new baking step at 130° C. the photoresist pattern 31 is used as an in-situ mask to etch the exposed portions of the intermediate metal contact pad by wet etching. The wet etching operating conditions are given thereafter. The gold layer is etched in a potassium iodide (KI) and iodine (I$_2$) solution. The copper layer is etched using a nitric acid (NO$_3$H) solution. The Cr/Cu overlap layer is etched in a mixture of H$_2$O, HNO$_3$ and Ce (SO$_4$)$_2$, 2(NH$_4$) SO$_4$, 2H$_2$O solution. Chromium is etched with the same solution as the Cr/Cu overlap layer. The use of a ceric ammonium sulfate based etching solution to etch the chromium is recommended because this solution does not attack aluminum. Alternatively the gold and copper layers can be eliminated by aqua regia (HCL+HNO$_3$) and the copper layer by HNO$_3$ solution. The resulting structure is shown in FIG. 4E. It is an other important feature of the method of the present invention to have only small amount of metal removed during this wet etching step, since the metal to be eliminated just corresponds to the exposed ring for each intermediate metal contact pad. As a result, no significant metal residues were noticed at this stage of the process.

Figure 4F:
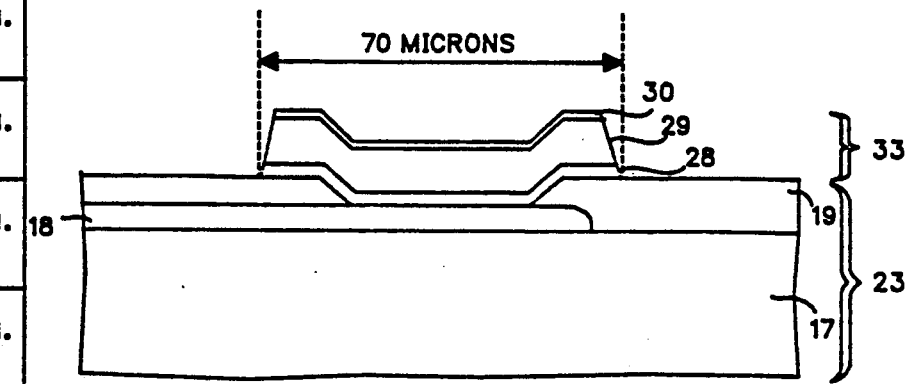

The remaining portions of the photoresist layer 31 are stripped off in a NMP solution, leaving the final metal contact pad 33 formed by a Cr-Cr/Cu-Cr-Au composite layer, which has the desired diameter size of 70 $\mu$m as shown in FIG. 4F.

Figure 4G:
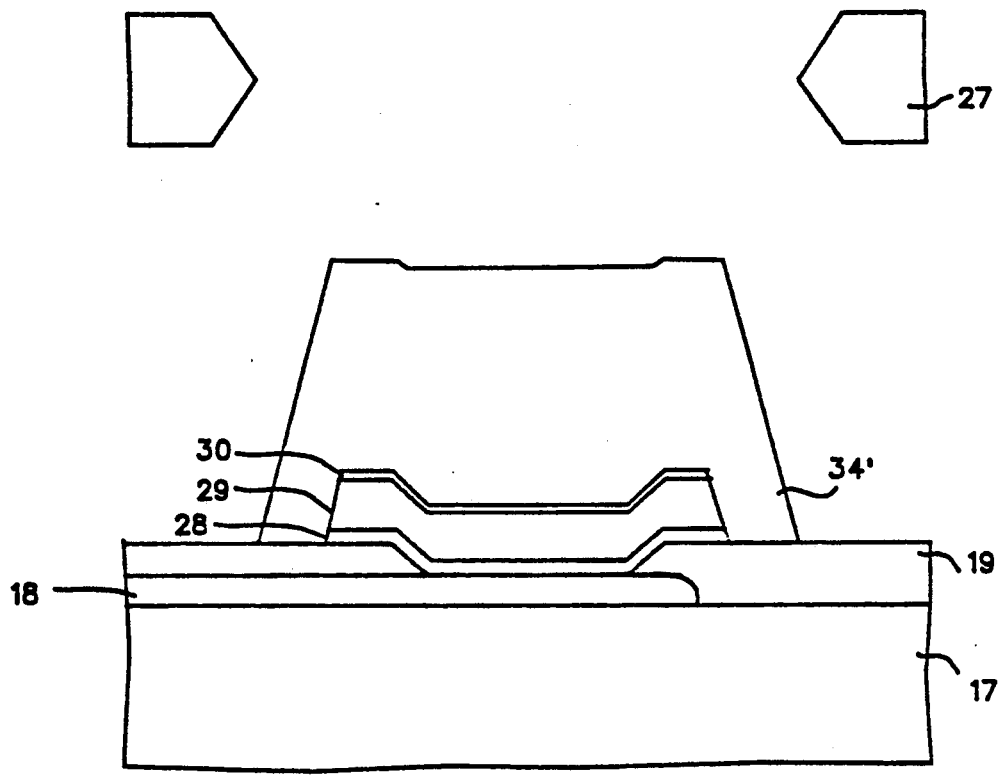
Figure 4H:
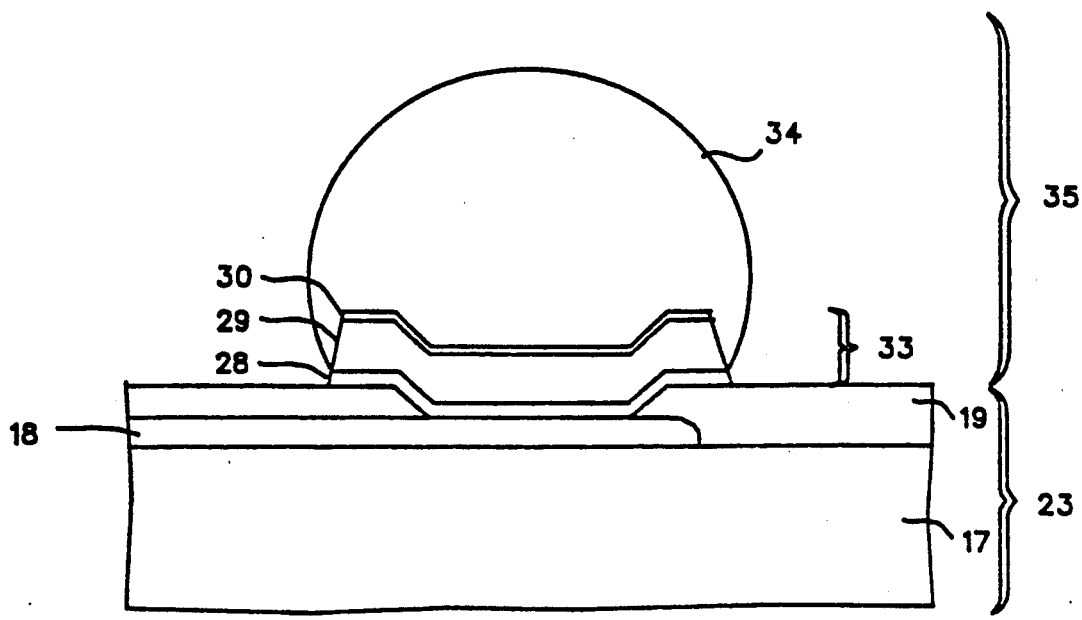

The contact terminal can now be achieved through standard processing steps as taught in conjunction with FIGS. 4G and 4H. However it is to be noted that, as shown in FIG. 4G, the tin-lead layer 34' is deposited through the same molybdenum mask 27 that was used in the initial steps of RF cleaning and metal layer deposition (FIGS. 4A and 4B). After solder reflow, the solder bump 34' forms the solder ball 34 finishing the contact terminal 35 that is represented in FIG. 4H.

The method of the present invention has some significant advantages in terms of contact resistance elimination, of threshold voltages of FETs when compared to the variants cited above, which result of the argon RF cleaning. In addition, because the quantity of metal to be eliminated is limited to the ring-shaped excess metal (30 μm width), instead of a large and continuous surface of metal (only about 2% is missing), less metal residues exist at the surface of the wafer, and therefore less contamination.

Using the present method, it has been produced 200 mm semiconductor wafers featuring a foot print of 50×50=2500 contact pads arranged in a matrix with a pitch of 100×200 μm and a contact pad diameter of 70 μm.

While the preferred embodiment of the present invention has been herein described, numerous modifications, changes and improvements will occur to those skilled in the art without departing from the spirit and scope of the present invention.

We claim:

1. A method of forming metal contact pads (33) of a determined size on a structure (23) of the type having an insulating substrate (17) with a metal land (18) formed thereon and a passivating layer (19) provided with a contact opening exposing a part of said metal land, said method comprising the steps of:
   a) depositing a metal layer (28) onto the structure through a metal mask (27) having holes greater than said determined size whereby an intermediate metal contact pad (33') is formed in said contact opening and at the close vicinity thereof;
   (b) applying a photoresist layer (31) onto the structure and, patterning said photoresist layer to leave a pattern (31) of said determined size aligned and above said intermediate contact pad (33') and leaving exposed a part of said intermediate contact pad in excess of said determinedsize;
   (c) delineating the intermediate metal contact pad (33'), said pattern (31) providing an in-situ mask, and removing the excess part to provide the metal contact pads (33) of said determined size; and,
   d) removing the remaining photoresist pattern (31).

2. The method of claim 1 further comprising prior to the step a) of RF cleaning the structure by argon ion bombardment using the metal mask (27) of step a).

3. The method of claim 1 wherein the said metal layer consists of a Cr(28)-Cr/Cu-Cu(29)-Au(30) composite layer.

4. The method of claim 1, wherein the step b) of patterning comprises the steps of:
applying a positive resist layer onto the structure;
baking the resist layer;
aligning the structure with a chromium mask (32);
exposing the resist layer to UV light in a proximity printer or stepper; and,
developing the resist layer in a developer.

5. The method claim 3 wherein the step of removing the excess metal comprises the steps of:
etching the Au layer with a iodine and potassium iodide solution;
etching the Cu and Cr layers with a nitric acid solution; and,
etching the Cr/Cu overlap layer in a mixture of ceric ammonium sulfate solution.

6. The method of claim 5 wherein the step of etching the Au or Cu layer is completed in a HCl+HNO$_3$ solution.

7. A method of forming metal contact terminals (35) of a determined size on a structure (23) of the type having an insulating substrate (17) with a metal land (18) formed thereon and a passivating layer (19) provided with a contact opening exposing a part of said metal land, said method characterized by the steps of:
   a) depositing a metal layer (28) onto the structure through a metal mask (27) having holes greater than said determined size whereby an intermediate metal contact pad (33') is formed in said contact opening and at the close vicinity thereof;
   b) applying a photoresist layer (31) onto the structure and, patterning said photoresist layer to leave a pattern (31) of said determined size aligned and above said intermediate contact pad (33') and leaving exposed a part of said intermediate contact pad in excess of said determined size;
   (c) delineating the intermediate metal contact pad (33'), said pattern (31) providing an in-situ mask, and removing the excess part to provide a final metal contact pad (33) of said determined size;
   d) removing the remaining photoresist pattern (31);
   e) aligning the structure with a metal mask having a hole centered with said final metal contact pad (33);
   f) depositing a lead-tin solder layer (34') over the metal mask forming a solder bump (34') on each said final metal contact pad and,
   g) reflowing each said solder bump to form a solder ball (34), whereby the metal contact terminals are formed (35) at each final metal contact pad.

8. The method of claim 7 wherein the metal mask of step a) is the metal mask of step e).

9. The method of claim 7 wherein said metal layer consists of a composite Cr-Cr/Cu-Cu-Au layer.

* * * * *